United States Patent
DeSantolo et al.

[11] Patent Number: 5,976,623
[45] Date of Patent: Nov. 2, 1999

[54] PROCESS FOR MAKING COMPOSITE FILMS

[75] Inventors: Anthony Michael DeSantolo, North Plainfield; Mary Louise Mandich, Martinsville, both of N.J.

[73] Assignee: Lucent Technologies Inc., Murray Hill, N.J.

[21] Appl. No.: 08/753,859

[22] Filed: Dec. 3, 1996

[51] Int. Cl.⁶ .................................................. C23C 16/00
[52] U.S. Cl. ........................... 427/255.28; 427/255.394; 427/255.395; 427/255.18; 427/569; 427/579
[58] Field of Search .......................... 427/255.2, 255.1, 427/255, 579, 578, 569, 255.28, 255.394, 255.395, 255.18; 118/723 ME

[56] References Cited

U.S. PATENT DOCUMENTS

| | | |
|---|---|---|
| 4,989,541 | 2/1991 | Mikoshiba et al. ..................... 118/723 |
| 5,192,370 | 3/1993 | Oda et al. ............................... 118/723 |
| 5,269,848 | 12/1993 | Nakagawa ................................ 118/723 |
| 5,332,689 | 7/1994 | Sandhu et al. ......................... 437/109 |
| 5,356,672 | 10/1994 | Schmitt, III et al. .................. 427/446 |
| 5,383,970 | 1/1995 | Asaba et al. ........................... 118/726 |
| 5,387,777 | 2/1995 | Bennett et al. ..................... 219/121.43 |
| 5,525,379 | 6/1996 | Takada et al. ......................... 427/571 |
| 5,571,571 | 11/1996 | Musaka et al. ........................ 427/574 |
| 5,571,578 | 11/1996 | Kaji et al. .............................. 427/579 |
| 5,593,741 | 1/1997 | Ikeda ...................................... 427/579 |
| 5,641,546 | 6/1997 | Elwell et al. ........................... 427/575 |

Primary Examiner—Roy V. King
Attorney, Agent, or Firm—Richard J. Botos

[57] ABSTRACT

The present invention is directed to a process for forming composite films. The films are formed on a substrate by directing a gas containing reactant species onto the substrate. The composite film is formed from an interaction between two reactant species. At least a portion of the substrate remains within the purview of the plasma discharge while the composite film is formed on the substrate.

8 Claims, 2 Drawing Sheets

PROCESS FOR MAKING COMPOSITE FILMS

BACKGROUND OF THE INVENTION

1. Technical Field

The present invention is directed to a process and apparatus for depositing thin films made of a composite material formed from at least two gaseous reactants, wherein the interaction of the reactants must be controlled in order to obtain a film of the desired quality.

2. Art Background

Composite films, i.e. films of materials formed from at least two different elements such as silicon nitride ($Si_3N_4$), silicon dioxide ($SiO_2$), aluminum oxide ($Al_2O_3$), aluminum nitride (AlN), and titanium oxide ($TiO_2$) are formed by introducing reactive gases into a chamber. The reactive gases are precursor gases for films of the desired material. Since the gases react to form the desired composite material, the reactions must be controlled in order to obtain a film of the desired material.

Composite films are formed using techniques such as Chemical Vapor Deposition (CVD). In CVD, a non-volatile solid film is formed on a substrate by a surface-pyrolized reaction of the gaseous reagents. A typical CVD reaction process comprises the following steps, (1) gaseous reagent and inert carrier gas are introduced into the reaction chamber, (2) gaseous reagent is transported by convection and diffusion to the surface of the substrate, (3) reagent species are absorbed onto the substrate where they undergo migration and film forming reactions and (4) gaseous byproducts of the reaction and unused reagents are removed from the chamber. The pressure in the deposition chamber may be atmospheric or reduced as low as a fraction of 1 Torr, as in the respective cases of Atmospheric Pressure CVD (APCVD) or Low Pressure CVD (LPCVD). The energy required to drive the reaction is supplied as heat to the substrate. For practical reaction rates, substrates are typically heated to temperatures ranging from about 500° C. to as high as 1600° C.

If the energy for the reaction is supplied by an RF electric field which powers a gas plasma discharge in the deposition chamber near the substrate surface, then the substrate temperature need not be as high. In such processes (referred to as Plasma Enhanced CVD (PECVD), the substrate temperature is 300° C. or less. However, in PECVD, the substrate and the film formed thereon are immersed in the plasma discharge, which will potentially damage the substrate and the film during growth. Other disadvantages of CVD processes include the reaction and nucleation of the reactants in the gas phase. When growing composite films, the reaction between the reagent gases must occur in the film to obtain a film with the desired uniformity. If the reaction occurs in the gas phase, the reaction products precipitate onto the substrate surface and contaminate the growing film.

Downstream CVD processing has been employed to avoid the problems associated with permitting the plasma to contact the substrate. As its name implies, in downstream plasma processing, the CVD reagent gas is introduced into the reaction chamber downstream of the plasma. Physical Vapor Deposition (PVD) has also been utilized. PVD includes methods of evaporation (metallizing), sputtering, molecular beam epitaxy, and vapor phase epitaxy. PVD processes typically occur in a chamber evacuated to a pressure of less than $10^{-6}$ Torr. The material from which the film is formed is present in the chamber in bulk solid form. The material is converted from the solid, condensed phase to the vapor phase using thermal energy (i.e. evaporation) or momentum transfer (i.e. sputtering). The atoms or molecules of the material condense on the substrate (and the chamber walls) as a thin film. If the pressure becomes too high, the molecules or atoms start to collide with a frequency that reduces the deposition rate.

Reactive evaporation and sputtering processes involve the intentional introduction of oxygen, nitrogen, or other reactive gas to form a thin film of an oxide, nitride or other composite material. In such processes, the pressure must be carefully controlled to maintain an effective environment for deposition. If the pressure is too high, the atoms or molecules will react in the gas phase. Furthermore, the source of the reactive atoms or molecules is subject to contamination by the reactant gases if it is allowed to come into contact with these gases.

U.S. Pat. No. 5,356,672 to Schmitt, III et al. describes a method for forming a thin film of a composite material on a substrate. The composite film is formed by the interaction between a first reagent gas and a second reagent gas. The interaction is controlled by translating a substrate from a first position where it is subjected to the discharge from a first gas jet apparatus to a second position where it is subjected to the discharge from a second gas jet apparatus. In one embodiment, the discharge from the first gas jet apparatus contains a mixture of one reactive species and a carrier gas. The discharge from the second gas jet apparatus contains a mixture of a second reactive species and a carrier gas. This method requires the substrate to be moved from the first position to the second position in a time less than the time required to complete film formation and it also requires that the wafer be moved frequently from the first position to the second position. In a second embodiment, the discharge from the gas jet apparatus contains a mixture of the first and second reactive species and the substrate is scanned or otherwise moved to subject all portions of the substrate to the discharge.

Such methods require that the substrate be subjected to background gases in the chamber as it is moved. The background gases typically contain molecular or atomic species that compete with the desired interaction between the first and the second gases. These competing interactions, if they occur to any significant extent, will have an undesired effect on the composition of the film. Furthermore, the requirement for fast and frequent translation is mechanically rigorous. Therefore, a simpler and more effective process solution is required.

SUMMARY OF THE INVENTION

In the process of the present invention, a composite film is formed on a substrate from gases that are discharged from at least one source. The composite film is formed from a combination of reactive species provided from the source and directed onto the substrate. In one embodiment of the invention, the reactive species are provided by reactant gases which are subjected to plasma discharge mechanism which generates the reactive species from the reactive gases. Other embodiments in which the reactant gases are sufficiently reactive without being subjected to a plasma discharge are also contemplated. The composition of the film is controlled by using inert carrier gas to control the relative amounts of reactive species in the discharge. The substrate is not removed from the purview of either the inert carrier gas, the reactant gas, or combinations thereof while the film is being formed on the substrate.

In the process of the present invention, the source is a chamber that is adapted to receive gas streams through at least two separate ports. A first reactant gas flows into the cavity through the first port and a second reactant gas flows into the cavity through the second port. The first port and the second port are oriented so that the reactant gases combine in the cavity. A illustrative arrangement is one wherein a supply line is in fluid communication with the cavity. This is referred to as an outer nozzle. Inside the supply line is a second supply line with a nozzle at the end thereof. This is referred to as the inner nozzle. The inner nozzle is oriented such that the discharge of the nozzle is placed in the cavity and directed toward the substrate on which the desired composite film is formed. One of the reactant gas streams enters the cavity through the outer nozzle and the other reactant gas stream enters the cavity through the inner nozzle. The cavity is equipped with a plasma generator such as a microwave cavity. A microwave cavity suitable for this purpose is described in U.S. Pat No. 5,356,672 which is hereby incorporated by reference. The microwave cavity is situated on the nozzle cavity downstream of the points where the individual gas streams enter the nozzle cavity.

In one embodiment of the present invention, the gas stream that flows through the second port is either a mixture of a second reactant gas and an inert carrier gas or pure inert carrier gas. The gas stream that flows through the second port alternates between the second reactant gas/carrier gas mixture and the carrier gas to control the composition of film formed from the reaction of the first reactant gas and the second reactant gas. The two gas streams intermix in the nozzle cavity.

In an alternate embodiment multiple sources are used. The combined discharge of these multiple sources is designed to continuously shower the entire surface of the substrate on which the film is grown during film growth. This embodiment contemplates at least three sources. The discharge from the first source is a mixture of the first reactant and a carrier gas. The discharge from the second source is a mixture of a second reactant and a carrier gas. Carrier gas is discharged from at least one other source. The discharge from these sources is directed at the surface of the substrate so that the surface of the substrate is continuously bathed in the combined discharge during film growth. The combined discharge does not have a uniform composition however. The combined discharge is controlled by positioning the sources and moving the surface of the substrate so that, while the film is being grown on a targeted area of the surface of the substrate, the untargeted portions of the substrate are bathed in a stream of carrier gas which acts as a barrier to the background gases in the chamber. The substrate surface is moved relative to the sources so that every portion of the surface on which the film is grown is within the targeted area at some point in the process.

In the embodiment of the present invention wherein the two reactant gases and an inert carrier gas are all introduced into a single cavity, the flow rates of the three gases (i.e., the first reactant gas, the second reactant gas, and the inert carrier gas) into the cavity are controlled to obtain a film of the desired composition and uniformity. This is based upon the recognition that a reaction does not occur, and a film of the desired composition does not form, when the first reactant gas and the non-reactive carrier gas are the only gases present in the cavity and, consequently, are the only gases in the cavity. This is true even when the plasma generator is operating. This reaction is "controlled" by controlling the flow of the second reactant gas. When film formation is desired, a mixture of all three gases flows from the cavity into the chamber.

The relative flow rates of the first reactant gas, the second reactant gas, and the carrier gas depends upon the kinetics of the reaction between the first and second reactant gases and the kinetics of the formation of the film. For example, if the desired composite film is $Si_3N_4$, the flow rate of nitrogen and the silicon precursor gas, $SiH_4$, are determined relative to the stoichiometry of the desired film. The desired composite has three atoms of silicon for every four atoms of nitrogen. However, in a given volume of $N_2$ gas there are approximately two atoms of nitrogen for every one atom of silicon in the same volume of $SiH_4$ at the same pressure. Therefore, to form a film of $Si_3N_4$, it is advantageous if the volumetric flow rate of the silane gas relative to the flow rate of the nitrogen is about 3 to about 2.

However, the stoichiometry is not the only factor that determines the relative flow rates of the gases into the inner nozzle. The kinetics of the reaction that forms the composite determine the concentration of the reactant gases in the gas streams flowing into the cavity. Since one reactant typically reacts at a different rate than the second reactant to form the desired composite, the flow of one reactant needs to be suspended periodically to allow the slower reactant to react with any excess of the faster reactant to avoid the formation of undesired composites through competing reactions. One skilled in the art will appreciate that the relative flow rates of the first and second reactant gases must be determined empirically, because the flow rates depend on the kinetics of the reaction and the stoichiometry of the particular composite film that is desired. The process of the present invention allows further flexibility because the flow of one of the reactant gases is capable of periodic suspension during film formation. Such control enables the formation of a film with the desired stoichiometry while maintaining the substrate on which the film is being formed in a continuous flow of gas (i.e. a gas stream containing only one of the reactant gases and the non-reactive carrier gas). This ensures that the film being formed is constantly subjected to a protective shower of gas. The flux of gas in this shower directed toward the substrate surface serves to sweep away molecules or atoms in the background gas so that they do not reach the film being formed. The background gas contains water vapor and other contaminants that adhere to the wall of the chamber from previous processing, cleaning and cycling to normal room air.

In another embodiment of the invention, gas streams are directed onto the substrate from a plurality of sources. One or more of these sources are contemplated as being equipped with a plasma discharge source, as required by the process for film formation. One skilled in the art will appreciate the flexibility provided by this embodiment, which permits the substrate on which the film is formed to be continuously showered by the discharge from these sources in either a combination of reactant gases and carrier gases or pure inert carrier gas during film formation. In this embodiment, portions of the substrate are restored or otherwise rotated in and out of the purview of the discharge streams that contain the reactant gases. The portions of the substrate that are not directly within the purview of the gas from the source or sources from which the reactant streams emanate are still showered by streams of inert carrier gas during film formation.

DETAILED DESCRIPTION

Figure 1:
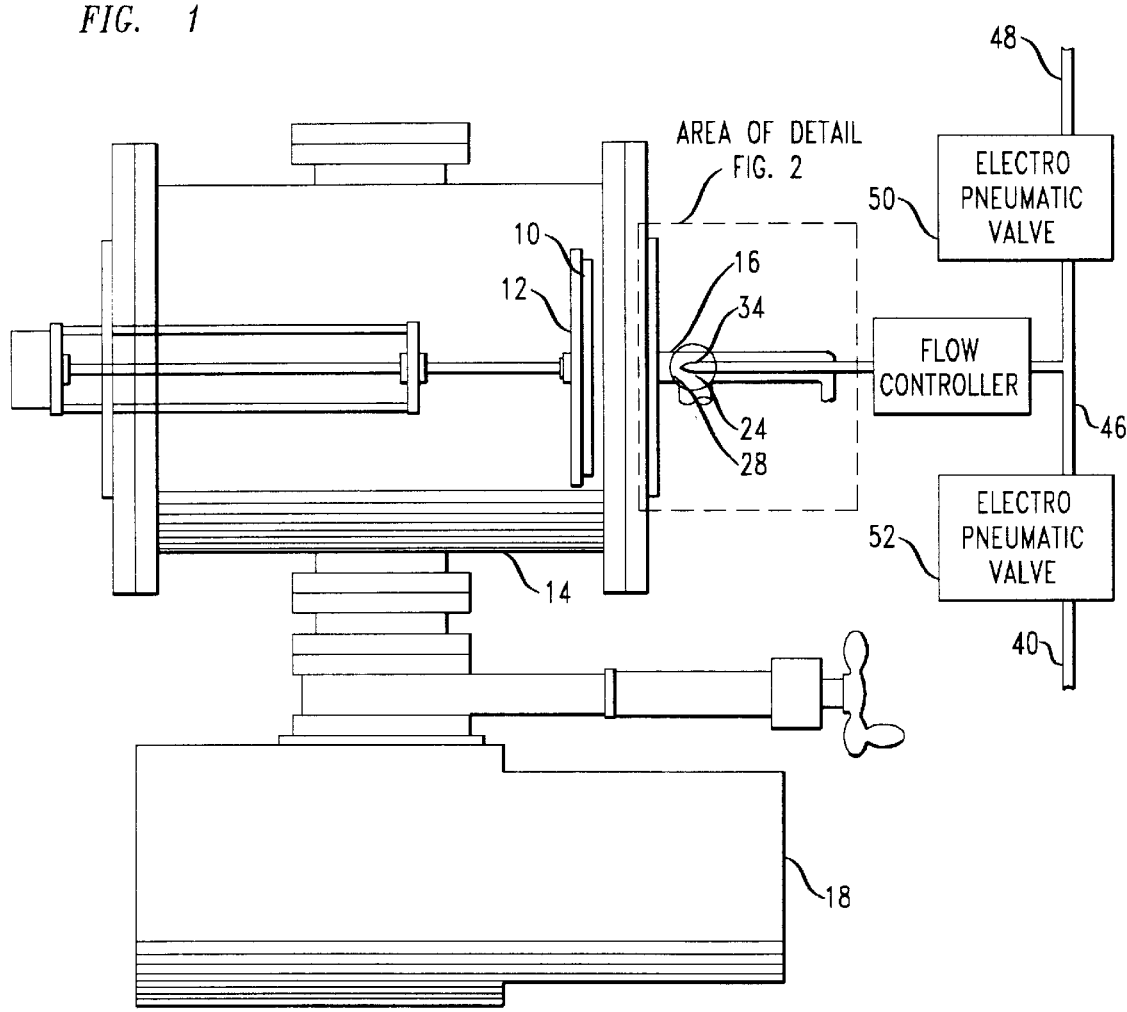
FIG. 1 is a schematic of an apparatus used to practice the process of the present invention.

The present invention is directed to a process for forming composite films. Composite films are films that are composed of more than one element. Composite films are used in a variety of applications. For example, since composite films have useful dielectric properties, they are used as insulating layers in semiconductor devices. Examples of composite films used for this purpose include silicon nitride ($Si_3N_4$), silicon dioxide ($SiO_2$), silicon oxynitride, aluminum oxide ($Al_2O_3$), aluminum nitride (AlN), and titanium oxide ($TiO_2$). The process of the present invention is also useful for forming composite metal films such as metal suicides (e.g., $TiSi_2$, $MOSi_2$, $TaSi_2$, $WSi_2$, $CoSi_2$, $NiSi_2$, PtSi, and $Pt_2Si$), metal nitrides (e.g. TiN, TaN, NbN, ZrN), metal carbides (TiC, TaC), and metal borides ($TiB_2$) for use as conductive layers in semiconductor devices. Because the properties of such films are highly composition-dependent, processes are required which ensure that the resulting films are not contaminated with species that adversely affect film properties.

Composite films are formed by providing an environment that is favorable for forming the desired composite. In the process of the present invention, the composite film is formed from the interaction of two reactants. In one embodiment of the present invention, the reactants are reactive species that are generated by introducing the reactant gas into a plasma generator. Each gas stream contains a reactant gas from which a reactant molecular or atomic species is generated when the gas is subjected to the energy from the plasma-generator. The species then recombine to form the desired composite. The reactive environment in which the composite is formed are controlled to favor the kinetics of composite formation over the kinetics for forming impurities. Other embodiments are contemplated in which one or more of the reactant gases need not be subjected to a plasma-generator in order to be reactive. In these embodiments a plasma-generator is optionally used to generate additional reactive species.

One source of impurities that compete with the formation of the desired composite is the background gas in the chamber in which the composite film is formed. In the process of the present invention, the substrate is isolated from the chamber background during composite film formation by maintaining the substrate within the purview of the plasma discharge during film formation. The flow of gas from the discharge source to the substrate provides a high flux of directed gas flow which sweeps away background gases that would otherwise diffuse to the surface of the substrate. This reduces the amount of interaction that would otherwise occur between the background gas and the reactive species that form the composite film during film formation.

In the embodiment of the present invention in which the reactant gases are subjected to a plasma-generator which generates the desired reactive species, a plasma is generated in a cavity that communicates with the chamber in which deposition occurs via an opening. The reactants are introduced into the chamber through the cavity so that the reactants are properly directed to the substrate on which the composite film forms. In one embodiment of the present invention, the reactant gases are introduced through separate ports and combine in a single cavity equipped with a plasma generator. For ease of explanation, the present invention will be described in terms of an embodiment in which two reactant gas streams are combined to form the desired composite. One skilled in the art will readily appreciate how to apply the principles of the present invention to those instances where three or more reactant gas streams are combined to form the desired composite.

In order to accommodate the kinetics of film formation, and to maintain gas flow rates and pressures that are high enough to sustain the plasma discharge in the cavity and to suppress plasma formation in the inner nozzle, the reactant gas is combined with an inert carrier gas. The higher flow rates permitted by the presence of the inert carrier gas also keep the walls of the nozzle cooler, which suppresses the dissociation of reagent species thereon. The reactant gases are introduced into the cavity in a manner that provides adequate intermixing of the two gases. In the embodiment wherein the two reactant gases are introduced into a single cavity equipped with a plasma generator, adequate intermixing is achieved by the introduction of one reactant gas into the cavity via a first port and the introduction of the second reactant gas into the cavity via a second port in the form of an inner nozzle which directs the second gas stream directly into the cavity. This arrangement prevents significant intermixing of the reactant gases upstream of the cavity. The gas flow through both the first port and the inner nozzle is commenced before the plasma is struck, and is continuous throughout film formation. The composition of the gas flowing through the inner nozzle is controlled through the use of a manifold which is connected to two separate gas supplies. One of the supplies is pure, inert carrier gas with no reactant gas mixed therein. The second supply is inert carrier gas with a small fraction of reactant gas therein. The flow rates and pressures of the gases in the two manifold supply lines are approximately equal. During film formation, the manifold is switched from the first line to the second line to provide a constant flow rate of gas into the plasma generator. However, film formation only occurs when the plasma contains species from both reactant gases.

Since the kinetics of film formation varies from composite to composite, the present invention is described in term of the embodiment in which the desired composite is $Si_3N_4$. In this embodiment, the first reactant feed stream is a mixture of nitrogen and a first non-reactive carrier gas and is introduced into the cavity via the outer nozzle. Through the inner nozzle is directed either a stream of the pure inert carrier gas or a stream of the inert carrier gas mixed with silane, $SiH_4$, which is the second reactant gas. Both streams are provided to the inner nozzle via a manifold. A first supply line to the manifold connects the manifold with a supply of the pure inert carrier gas. A second supply line connects the manifold with a source for the pure inert carrier gas combined with the second reactant gas. Each supply line is equipped with a valve that controls the flow of the gas therein to the manifold. The backing pressure and conductances of the first and second supply lines are approximately equal and the valves are interconnected so that one shuts off simultaneously as the other turns on. Switching in this manner ensures that there is no significant change in pressure or flow rate in the gas stream exiting the inner nozzle.

Since a particular component of the composite film is only added when the reactant gas providing this component is supplied to the plasma generator, formation of the desired composite film is controlled by controlling the rate and duration of the addition of each component to the reactive gas mixture. As previously described, this enables the film to be formed in a manner that is tailored to the kinetics of film formation for the particular film.

The following example is provided as an illustration of the general concepts outlined above.

EXAMPLE 1

Figure 2:
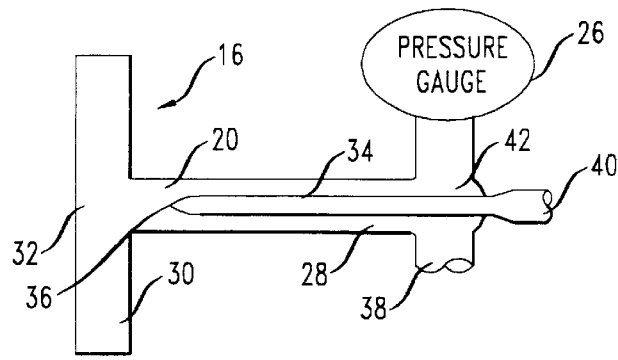
FIG. 2 is a detail of a portion of the apparatus illustrated in FIG. 2.

Silicon nitride ($Si_3Ni_4$) composite films were formed on silicon wafers according to the process of the present invention. The films were prepared in the apparatus depicted in FIG. 1. A silicon wafer 10 was placed onto a holder 12 and loaded into a plasma deposition chamber 14 using standard equipment and procedures well known to those skilled in the art. The silicon wafer was positioned so that the surface on which the composite film is formed directly faced a source 16 equipped with a dual gas nozzle. The silicon wafer 10 was positioned about 3.5 cm from the source 16. The dual gas nozzle source 16 is illustrated in detail in FIG. 2. The dual gas nozzle source 16 has a first outer nozzle 28 that was standard quartz tubing (10 mm ID and 12 mm OD) affixed to a quartz disc 30 with a 10 mm hole 32 drilled therein. The outer nozzle 28 was attached to the disc so that it was centered on the hole 32. The inner nozzle 34 was standard tubing (3 mm ID and 5 mm OD) centered in the outer gas hole. The tubing had an exit orifice 36 (0.4 mm diameter) which directed the gas flow toward the wafer surface 10 (in FIG. 1). Both the outer nozzle 28 and the inner nozzle 34 had ports (38 and 40, respectively) through which reagent gases enter the nozzles. The outer nozzle 28 was equipped with another port 42 for measuring the pressure in the nozzle.

The chamber 14 (FIG. 1) was evacuated to a pressure in the range of about 10 mTorr to about 100 mTorr using a 140 l/sec roots blower 18. Once the chamber pressure was in this range, gas flow was commenced through the dual nozzle source 16. The reactant gases from which the $Si_3Ni_4$ films were formed were nitrogen ($N_2$) and silane ($SiH_4$). Both reactant gases were diluted with a non-reactive carrier gas. Helium gas (He) was used for this purpose.

The dual nozzle source 16 contained an inner chamber 20 into which the two gas streams flowed. The dual nozzle source 16 was equipped with a quartz flange 30 which was used to fix the dual nozzle source 16 to the chamber 14 in which the wafer 10 was placed. The silane gas, diluted with helium, flowed through the inner nozzle 34 at a pressure of about 600 Torr. The nitrogen gas, also diluted with helium, flowed into the nozzle chamber through outer nozzle 28. The pressure in the outer nozzle was about 2 Torr. A pressure gauge interfaced to a pressure controller 26 was used to regulate the pressure of the gas to the outer nozzle 28. A similar pressure gauge interfaced to a pressure controller (not shown) was used to regulate the pressure of the silane gas/carrier gas mixture and pure carrier gas in the inner nozzle 34.

The gas stream flowing through the outer nozzle 28 was about 10 volume percent nitrogen diluted with helium. The flow rate of the dilute nitrogen gas was about 400 sccm at a pressure of 2 Torr in the outer nozzle. The gas stream flowing through the inner nozzle 34 was initially pure helium. The flow rate of the helium was about 2300 sccm at a pressure of 600 Torr in the inner nozzle.

The dual nozzle source 16 was equipped with a microwave cavity 24. The cavity 24 surrounded a one-inch length of the dual nozzle source 16. The microwave cavity 24 was positioned about 2.8 cm downstream from the inner nozzle 34. While the nitrogen/helium mixture and the pure helium were flowing through the outer and inner nozzles, respectively, the microwave discharge was commenced. The microwave cavity used was an Evenson style cavity such as the one described in U.S. Pat. No. 5,356,672. Absorbed microwave powers ranging from about 200 W to about 400 using a Micro-Now Model # 420B1 Microwave Power oscillator to generate 2.455 GHz microwaves. The oscillator was connected to the microwave cavity via a coaxial cable. The microwave discharge was stabilized for about five minutes before the silane flow was commenced.

The effect of the microwave power used on the refractive index of the resulting film is reported in Table 1 below. The refractive index of the resulting films was measured using ellipsometry. For silicon nitride films, the refractive index indicates the stoichiometry of the film. Stoichiometric films of $Si_3N_4$ have a refractive index of 2.01. If the measured refractive index varies substantially from this value, that fact indicates that the film was contaminated. If the refractive index is lower than 2.01, that fact indicates that the film is contaminated with silicon dioxide ($SiO_2$). $SiO_2$ contamination will result if there are oxygen-containing contaminants present in the chamber during film formation. In the system used in the present example, the primary contaminant appears to be oxygen. Contamination by non-silicon/oxygen/nitrogen contaminants was monitored and, due to their very low concentration, determined to be unlikely sources of contamination.

If the refractive index is significantly higher than 2.01, this indicates that the film contains unreacted silicon. Since unreacted silicon will react with oxygen to form $SiO_2$ when the film is exposed to air, the presence of unreacted silicon in the film is highly undesirable.

TABLE 1

| Microwave Power Absorbed (Watts) | Film Thickness $T_L(0)$ (Angstroms) | Refractive Index $N_L$ |
| --- | --- | --- |
| 400 | 668 | 1.982 |
| 330 | 674 | 1.957 |
| 255 | 617 | 1.938 |
| 185 | 576 | 1.932 |

The data in Table 1 illustrates how the index of refraction ($N_L$) changed as the microwave power that was absorbed by the plasma gas source was varied. The 10% $N_2$/He and 23.4 ppm $SiH_4$He flows were maintained at 377 sccm and 2090 sccm, respectively, for each film. Also, each film was grown for 30 minutes using an alternating gas duty cycle of 25% (i.e. the inner nozzle alternated between having $SiH_4$/He flowing for 1.2 seconds and helium flowing for 3.6 seconds). The refractive index increased with increasing microwave power. The relationship between an increase in absorbed microwave power and an increase in refractive index is not linear, however. For example, the 70 Watt increase in the absorbed power from 185 Watts to 255 Watts provided a 0.3% in $N_L$ whereas the 70 Watt increase from 330 Watts to 400 Watts provided a 1.3% increase in $N_L$.

A gas manifold 46 was provided through which the silane gas/inert carrier gas mixture and the pure inert carrier gas are supplied to the inner nozzle 34. The pressure gauge interfaced to a pressure controller 26 regulated the flow of gas from the manifold 46 to the inner nozzle 34. The silane gas mixture flowed into the manifold via line 48 and the pure inert carrier gas flows into the manifold via line 40. Lines 48 and 40 were equipped with valves 50 and 52, respectively, which regulate the flow of the individual gas streams into the manifold 46. Although bellows-sealed electropneumatic valves which have a nominal opening or closing time of less than one second were found to be suitable for valves 52 and 50, one skilled in the art will recognize that a variety of control valves are suitable for this purpose. The valves 52 and 50 are operated such that one valve is closed while the other valve is opened. As a result of this simultaneous operation, little or no change in pressure or flow rate occurred when switching between the two gases. Another embodiment of the present invention is contemplated in which the pure inert carrier gas flows continuously into the manifold 46 and the reactive gas is pulsed into the manifold to obtain the desired the amount of silane gas in the feed to the nozzle 16. However, it is more difficult to maintain a constant pressure and flow rate in this embodiment.

The effect of flow rate of the 10% $N_2$/He reagent on film quality was also observed. Films were grown under conditions of constant microwave power (400 Watts absorbed), constant 23.4 ppm $SiH_4$/He flow (2250 sccm), and a 25% alternating gas duty cycle. However, for this set of films, the total deposition time was adjusted in order to obtain films of approximately equal thickness. The data in Table 2 summarizes the effect that changing the 10% $N_2$/He flow rate has on film quality. The results are reported in Table 2 below.

TABLE 2

| 10% $N_2$/He Flow | Deposition Time | Thickness (Å) | $N_L$ |
|---|---|---|---|
| 821 sccm | 15 minutes | 787 | 2.008 |
| 582 sccm | 17 minutes | 743 | 1.990 |
| 382 sccm | 20 minutes | 758 | 1.981 |
| 228 sccm | 25 minutes | 808 | 1.974 |

Table 2 illustrates that the refractive index of the films increased from 1.974 to 2.008 as the flow rate of the 10% $N_2$/He gas stream increased from 228 sccm to 821 sccm.

The effect of the $SiH_4$/He flow rate on the refractive index of the film was also examined. A 25% alternating gas duty cycle was used to control the $SiH_4$/He flow rate as described above. The silane concentration was 22.7 ppm, the 10% $N_2$/He flow rate was maintained at 325 sccm, and the absorbed microwave power was maintained at 400 Watts. Table 3 below illustrates that, when the $SiH_4$/He flow was reduced from 2330 sccm to 2030 sccm, the refractive index remained relatively constant (1.932 at 2330 sccm and 1.934 at 2030 sccm). However, when the flow was reduced to 1720 sccm and 1370 sccm, small decreases in the refractive index (1.924 at 1720 sccm and 1.918 at 1370 sccm) were observed. A film with a refractive index of 1.924 has an oxygen content which is about eight percent of the atomic fraction of nitrogen (atomic ratio of O/N=0.08) and a film with a refractive index of 1.918 has an oxygen content of about 10% of the atomic fraction of nitrogen. Thus, a decrease in the flow rate of the reactant gas permits the incorporation of greater amounts of oxygen (and, presumably, other background contaminants in the film).

TABLE 3

| $SiH_4$/He Flow | Deposition Time | $T_L(0)$ (Å) | $N_L$ |
|---|---|---|---|
| 2330 sccm | 15 minutes | 362 | 1.932 |
| 2030 sccm | 18 minutes | 385 | 1.934 |
| 1720 sccm | 21 minutes | 343 | 1.924 |
| 1370 sccm | 25 minutes | 282 | 1.918 |

Based on the pressures maintained in the inner nozzle (600 Torr) and outer nozzle (2 Torr) specified above, flow rates of 2300 sccm to the inner nozzle and 400 sccm to the outer nozzle, the following objectives were met when the pressure in the chamber was maintained in the range of 300 mTorr to 400 mTorr:

1. the plasma was sustained in the outer nozzle 28;
2. the pressure in the inner nozzle suppressed the formation of a plasma in the inner nozzle 34;
3. the chamber pressure was sufficiently low to provide an environment that did not favor the recombination or the reaction of the dissociated molecular and atomic species in the plasma;
4. the pressure and flow rates of the gases flowing through both the inner and outer nozzles were adequate to suppress the dissociation of the reagent gases on the walls of the nozzles;
5. the flow rates of the reagent gases are adequate to provide a reasonable rate of film formation; and
6. the flow rates did not exceed the available pumping so that the desired background pressures are maintained relative to the dimensions of the inner and outer nozzles.

Although the conditions used in this example were adequate to provide an environment in which these objectives are met, it will be readily apparent to one skilled in the art that there are numerous conditions that are useful to achieve these objectives.

The nitrogen gas stream introduced through outer nozzle 28 contained 10 percent by volume nitrogen diluted with helium. The gas stream from the manifold 46 through the inner nozzle 34 was either pure helium, or helium mixed with silane gas. Several films were prepared and the concentration of the silane gas in the feed stream was varied from film to film. The duty cycle was also varied. The duty cycle is defined as the percent of time that the silane/helium gas mixture flowed to the inner nozzle as a function of total time that gas flowed to the inner nozzle.

Before film growth commenced, the dual nozzle source was stabilized. To accomplish this, gas flow was maintained to the cavity through both the inner and outer nozzles while sustaining the microwave plasma discharge. Reaction was avoided by flowing helium through the inner nozzle. This condition was maintained for about five minutes to stabilize the plasma.

Table 4 below summarizes the properties of the films that were made according to the above-described procedure. In addition, two additional films were prepared wherein the flow of both reagent gases into the microwave cavity was continuous (i.e. the duty cycle for the $SiH_4$/He mixture was 100 percent. The substrate on which these films were formed were Si(100) wafers which were nominally at room temperature during film growth. The composition (atomic ratio of oxygen/nitrogen) of the film was measured by Rutherford Backscattering, which is a film diagnostic technique well known to those skilled in the art.

TABLE 4

| Silane content in feed gas (ppm) | $SiH_4$/He Duty Cycle | Film Deposition Time (min) | Film Thickness (Å) | Refractive Index* | Atomic Ratio of Oxygen/ Nitrogen** |
|---|---|---|---|---|---|
| 15 | 100% | 10 | 1060 | 1.933 | 0.094 ± 0.002 |
| 15 | 50% | 20 | 1150 | 1.967 | 0.05 ± 0.01 |
| 15 | 25% | 40 | 850 | 2.002 | 0.007 ± 0.002 |
| 15 | 10% | 100 | 1024 | 2.041 | 0.011 ± 0.007 |
| 7.6 | 100% | 22 | 1100 | 1.949 | 0.10 ± 0.02 |

*Measurement Made Using Ellipsometry
**Measurement Made Using Rutherford Backscattering Table 4 demonstrates that the duty cycle affected the amount of oxynitride contamination in the film. For a silane concentration of 15 percent in the feed gas, the refractive index of the resulting film increased from a low of 1.93 when a duty cycle of 100 percent was used to the desired index when a duty cycle of 10 to 25 percent was used. The refractive index of the film formed using a duty cycle of 50 percent, while a significant improvement over the index of the film formed using a duty cycle of 100 percent, was still less than preferred.

Another effect observed from the data in Table 4 was that cycling the flow of the silane reagent from on to off provides a film with a more desirable refractive index than simply reducing the concentration of silane in a feed stream that flows continuously to the cavity during film formation. This is observed by noting that the refractive index of a the film formed from a feed stream with a silane concentration of 15 ppm and a duty cycle of 100 percent was 1.933. When the silane concentration in the feed stream was reduced to 7.3 ppm, but the duty cycle remained 100 percent, the refractive index of the resulting film was 1.949. However, when the concentration of the feed stream was maintained at 15 ppm and the duty cycle changed to 50 percent, the refractive index of the resulting film was 1.967. Consequently, in the context of the data in Table 4, halving the $SiH_4/He$ duty cycle from 100 percent to 50 percent provided a larger increase in the refractive index of the film than halving the concentration of the $SiH_4/He$ in the feedstream from 15 ppm to 7.3 ppm.

Figure 3:
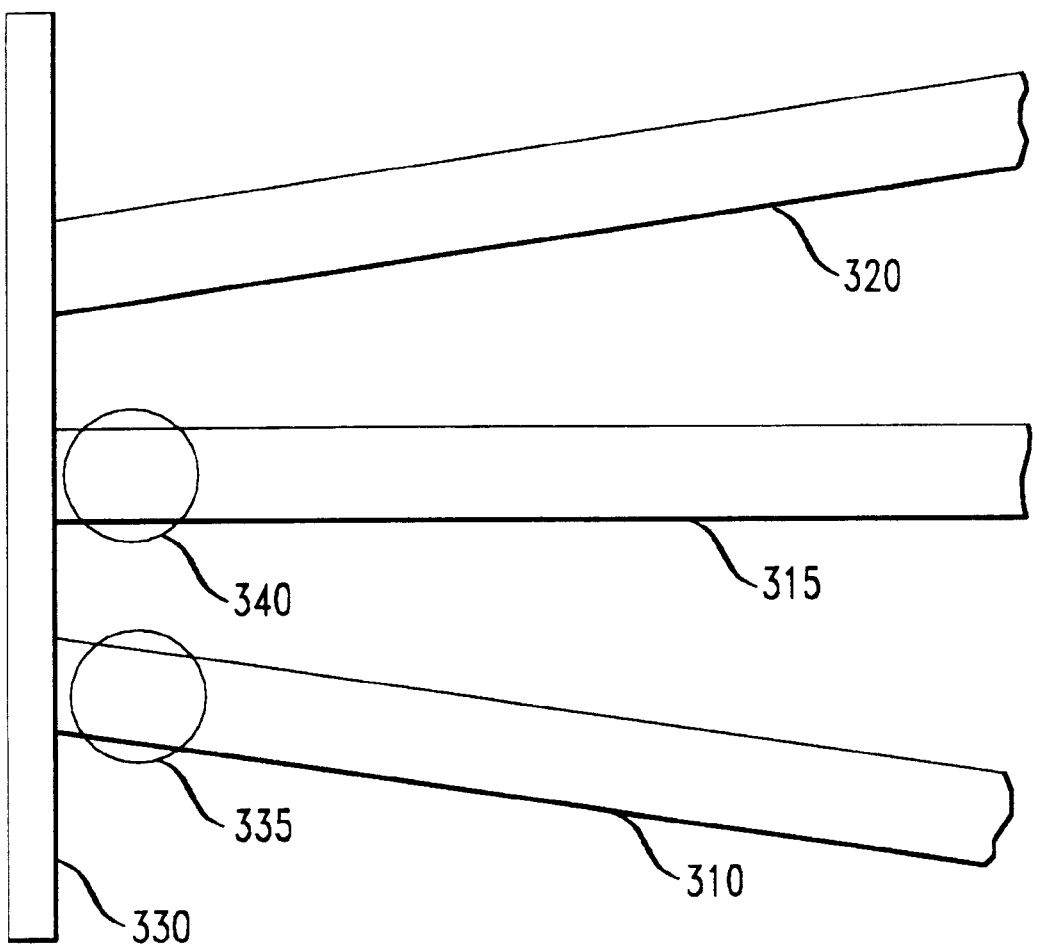
FIG. 3 is a schematic of an alternate embodiment of an apparatus used to practice the process of the present invention.

FIG. 3 illustrates an alternate embodiment of the present invention in which a plurality of sources are arranged such that the surface of the substrate on which the composite film is grown is continuously bathed in the discharge from these sources during film growth. In the embodiment depicted in FIG. 3, three sources, 310, 315, and 320, are affixed to a flange 330. Nozzles 310 and 320 are equipped with microwave cavities 335 and 340 respectively. Nozzle 320 is not equipped with a microwave cavity. An inert carrier gas is introduced through nozzle 320. The inert carrier gas serves to isolate the growing film from the background gases during film formation.

One skilled in the art will appreciate that the embodiment depicted in FIG. 3 can be modified in many different ways and still remain within the scope of the present invention. For example, the nozzles can be the dual nozzle type dipicted in FIG. 2. Also, there can be more than the three nozzles dipicted in FIG. 3. Furthermore, if certain reactants are used, the source for the reactant gas will not have to be equipped with a microwave source to generate the reactant species.

EXAMPLE 2

Silicon nitride films formed from the process of the present invention is contrasted with silicon nitride films formed by a process in which the growing film is contacted by background gas. This comparison demonstrates that, unless the growing film is isolated from the background gases in the manner prescribed by the present process (i.e. by maintaining the growing film within the purview of the reactant and carrier gases during film formation) the properties of the resulting film are adversely affected.

An apparatus was constructed that permitted a wafer to be moved from a first position to a second position. The apparatus had a wafer holder and, when a wafer was placed in the holder, the wafer was positioned at the source gas outlet in position one and was positioned in the background gas in position two. The center of the wafer was offset from the source outlets by 4.6 cm. The apparatus was also equipped with a stepper motor and a Geneva mechanism. By rotating this mechanism by 1800, the center of the growing film was 3 inches removed from the center of the source outlet. A barrier was employed to farther isolate the growing film from the source. The barrier was placed so that is was separated from the wafer by about two to three millimeters and divided the wafer in half.

The following experiments were performed to determine if exposing the films to background gases, by rotating the film out of the direct purview of the source, affects the film quality. A spot on the wafer was exposed to the the nitrogen/helium flow plus the silane/helium mix (through the inner nozzle) for 1.2 seconds, after which the wafer was continuously rotated 360° (time required=7.0 seconds). When the film returned to the output of the source, it was then nitrided (i.e. only pure helium flows through inner nozzle) for 6.9 seconds. This experiment was done with and without the barrier in place. The control for these experiments was exposing a spot on a wafer to the nitrogen/helium flow plus the silane/helium mix for 1.2 seconds, immediately followed by the nitriding step for 6.9 seconds. Table 5 indicates that the resulting films all had approximately the same refractive index and, therefore, roughly the same composition. The refractive index of these films was measured using ellipsometry.

TABLE 5

| Film | Film Thickness (Å)[1] | Refractive Index[2] | Fraction of Time Out of Purview of Source Gases |
|---|---|---|---|
| A | 762 | 1.995 | 0.5[3] |
| B | 775 | 2.008 | 0.5[4] |
| C | 809 | 1.998 | 0[5] |

[1]Measured by ellipsometry
[2]Measured using Rutherford Backscattering
[3]Without barrier, portions of wafer were rotated from purview of gases; time measured as a fraction of total seconds some portion of wafer was exposed to source gas.
[4]With barrier, portion of wafer were rotated from purview of gases; time measured as a graction of total seconds some portion of wafer was exposed to source gas.
[5]Without barrier; entire wafer was maintained in purview of gases during enitire time the wafer was exposed to source gas.

The timing was then altered so that a spot on the wafer was again exposed to the nitrogen/helium flow plus the silane/helium mix for 1.5 seconds. In the next step, the wafer was rotated away from the source to the other side of the barrier for 38 seconds. Then the film was rotated back to its original position in front of the source where it was nitrided for 11 seconds and the cycle was then repeated. Table 6 describes the refractive index and the film thickness for this film, compared to the film thickness and the refractive index of a film that was formed without rotating the wafer from the purview of the incoming gases. The difference (2.4%) in the average refractive index between the film grown during rotation and the control film (grown under the previously described conditions) illustrates that exposure to background gases during film formation adversely affects the resulting film. Although applicants do not wish to be held to a particular theory, applicants believe that the decrease in refractive index is the result of increased exposure to the background gases, which permits increased amounts of oxygen to be incorporated into the film during formation.

TABLE 6

| Film | Film Thickness (Å)[1] | Refractive Index[2] | Fraction of Time Out of Purview of Source Gases |
|---|---|---|---|
| D | 330 | 1.940 | 0.25[3] |
| E | 425 | 1.990 | 0[4] |

[1]Measured by ellipsometry
[2]Measured using Rutherford Backscattering
[3]With barrier, portion of wafer were rotated from purview of gases; time measured as a graction of total seconds some portion of wafer was exposed to source gas.
[4]Without barrier; entire wafer was maintained in purview of gases during enitire time the wafer was exposed to source gas.

It should be noted that the partition does not completely isolate one portion of the wafer from the source gases because of the space between the partition and the substrate. Therefore, one would expect the film to be more adversely affected by exposure to background gas if it were rotated into a chamber entirely isolated from the source gases, rather than only partially isolated as in the above example.

What is claimed is:

1. A process for forming a compound film on a substrate comprising:

placing an article in a chamber;

directing a gas stream comprising at least one of a first reactant gas and a second reactant gas that combine to form a compound film toward a surface of the article on which the compound film is to be formed wherein the chamber has a pressure that provides an environment that does not favor reaction of the first reactant gas with the second reactant gas in the gas stream and that prevents the dissociation of the reactant gases on the chamber walls, and wherein the surface on which the film is to be formed is not removed from the purview of a gas stream comprising at least one of the first reactant gas, the second reactant gas, and an inert carrier gas during film formation where the chamber pressure is about 300 mTorr to abort 400 mTorr and wherein the gas stream is a combination of a first gas stream and a second gas stream, the first gas stream having a flow rate of about 228 sccm to about 821 sccm and the second gas stream having a flow rate of about 1370 sccm to 2330 sccm.

2. The process of claim 1 further comprising:

combining a first stream of gas and a second stream of gas in a nozzle chamber;

generating a plasma in the nozzle chamber;

directing the plasma through a nozzle in the nozzle chamber onto the substrate surface outside the nozzle wherein the first stream of gas contains a first reactant gas mixed with an inert carrier gas and the second stream of gas is supplied via a manifold which in turn is connected to a first gas supply which is a pure inert carrier gas and a second gas supply which is a carrier combined with a second reactant gas wherein the gas supply is switched from the first gas supply to the second gas supply to control the composition.

3. The process of claim 2 wherein the compound film formed is a silicon nitride film and where the first stream contains a mixture of nitrogen and an inert carrier gas and the second stream contains either a mixture of a silane precursor gas and an inert carrier gas or an inert carrier gas.

4. The process of claim 3 wherein the substrate is a silicon substrate.

5. The process of claim 3 wherein the inert carrier gas is selected from the group consisting of helium and argon.

6. The process of claim 3 wherein the flow of the silane precursor gas is reduced to essential zero intermittently during film formation to provide a silicon nitride film with the desired stoicmiometry.

7. The process of claim 2 wherein the first stream of gas is introduced into the nozzle chamber via an outer nozzle and the second stream is introduced into the nozzle chamber via an inner nozzle.

8. The process of claim 1 wherein the gases are directed onto the substrate on which the film is formed through a plurality of sources, wherein the plurality of sources are arranged such the substrate surface on which the film is formed is within the purview of the discharge from these sources during film formation.

* * * * *